United States Patent [19]

Kurihara et al.

[11] Patent Number: 5,757,184

[45] Date of Patent: May 26, 1998

[54] MAGNETIC FIELD DETECTION APPARATUS WITH BILATERAL ELECTRICAL SWITCH FOR INVERTING MAGNETIC SENSOR CURRENT

[75] Inventors: Kazuo Kurihara; Manabu Aizawa, both of Miyagi, Japan

[73] Assignee: Sony Corporation, Tokyo, Japan

[21] Appl. No.: 719,468

[22] Filed: Sep. 25, 1996

[30] Foreign Application Priority Data

Sep. 29, 1995 [JP] Japan ................................. 7-254254
May 27, 1996 [JP] Japan ................................. 8-131841

[51] Int. Cl.⁶ .......................... G01R 33/02; G01C 17/28
[52] U.S. Cl. .......................... 324/244; 33/361; 324/247; 324/258
[58] Field of Search ................. 324/207.16, 244, 324/247, 249, 253–255, 258, 260; 33/319, 355 R, 361, 363 R

[56] References Cited

U.S. PATENT DOCUMENTS

| | | | |
|---|---|---|---|
| 4,112,365 | 9/1978 | Larson et al. | 324/207.16 X |
| 4,403,515 | 9/1983 | Iwasaki | 324/207.16 X |
| 4,728,888 | 3/1988 | Bauer et al. | 324/253 |
| 4,851,775 | 7/1989 | Kim et al. | 324/260 X |
| 5,233,294 | 8/1993 | Dreoni | 324/207.16 |
| 5,239,264 | 8/1993 | Hawks | 324/253 |

*Primary Examiner*—Gerard R. Strecker
*Attorney, Agent, or Firm*—Hill & Simpson

[57] ABSTRACT

A magnetic detection apparatus is disclosed, the size and cost of which can easily be reduced and with which excellent sensitivity can be obtained. The magnetic detection apparatus according to the present invention has a magnetic sensor formed by winding a coil around a magnetic member, wherein change in a response waveform of an electric current allowed to flow in the coil of the magnetic sensor occurring when time-varying voltage is applied to the coil is detected. Since the response waveform of the electric current allowed to flow in the coil is changed in accordance with the intensity of an external magnetic field, the external magnetic field can be detected.

12 Claims, 13 Drawing Sheets

MAGNETIC FIELD DETECTION APPARATUS WITH BILATERAL ELECTRICAL SWITCH FOR INVERTING MAGNETIC SENSOR CURRENT

BACKGROUND OF THE INVENTION

1. Field of the Invention

The present invention relates to a magnetic detection apparatus having a magnetic sensor formed by winding a coil around a magnetic member thereof, and more particularly to a magnetic detection apparatus capable of improving the sensitivity thereof with a simple structure.

2. Related Art

A magnetic detection apparatus for detecting an external magnetic field, originally developed to serve as a detector for detecting a magnetic field or a measuring apparatus, has been widely used in a magnetic switch, a magnetic rotary encoder, a geomagnetism sensor and the like.

The magnetic detection apparatus of the foregoing type includes a magnetic detection apparatus having a Hall element, a magnetic detection apparatus having a flux gate sensor and a magnetic detection apparatus having a magneto-resistance effect device.

The magnetic detection apparatus having the Hall element, as shown in FIG. 1, uses the hall effect of a Hall element 103 having electrodes 101 and 102 at the two ends thereof to detect an external magnetic field. That is, the magnetic detection apparatus having the Hall element detects an external magnetic field in accordance with change in the hall voltage Vh generated in the Hall element 103. Assuming that the thickness of the Hall element 103 is d, an electric current flowing in the Hall element 103 is I and the magnetic flux passing through the Hall element 103 is B, the hall voltage Vh is expressed by Equation (1-1) below:

$$Vh = Rh \cdot I \cdot B / d \qquad (1\text{-}1)$$

Since the hall voltage Vh, however, is very low, the magnetic detection apparatus having the Hall element cannot easily detect a weak magnetic field, such as the geomagnetism having an intensity of about 0.3 gauss.

The magnetic detection apparatus having the flux gate sensor, as shown in FIG. 2, includes an annular magnetic core 110 made of special material which has a high magnetic permeability, and the hysteresis curve of which is, therefore, shifted attributable to an external magnetic field; and an exciting coil 111 and a detection coil 112 each of which is wound around the magnetic core 110.

When the above-mentioned magnetic detection apparatus detects an external magnetic field, a high frequency electric current is allowed to flow in the exciting coil 111 so as to magnetize the magnetic core 110 up to a saturated state. If no external magnetic field acts on the magnetic core 110 in the foregoing state, outputs from right and left coils 112a and 112b of the detection coil 112 are made to have the same waveforms. Since the right and left coils 112a and 112b of the detection coil 112 are connected to have opposite phases, the output from the left coil 112a of the detection coil 112 and that from the right coil 112b of the same are offset. As a result, the detection coil 112 does not output anything.

If external magnetic field Hex is applied in a direction from N to S shown in FIG. 2 in a state where the exciting coil 111 is, in the magnetic core 110, generating, for example, right-handed rotating magnetic flux B, the external magnetic field Hex acts as a bias magnetic field, thus causing the right-hand portion of the magnetic core 110 to quickly be saturated. On the other hand, the left-hand portion of the magnetic core 110 is saturated after a delay. Since the right and left coils 112a and 112b of the detection coil 112 are connected to have opposite phases as described above, the difference between the output from the left coil 112a of the detection coil 112 and that from the right coil 112b of the same is outputted to correspond to the magnitude of the external magnetic field Hex.

However, the above-mentioned magnetic detection apparatus, having the structure such that the magnetic signal is converted into an electric signal by the detection coil 112, requires that additional windings be added to the detection coil 112 when the sensitivity of the magnetic detection apparatus is intended to be raised. When the effect of focusing the external magnetic field Hex is intended to be improved, the shape of the magnetic core 110 must be enlarged. Therefore, the magnetic detection apparatus of a type having the flux gate sensor encounters difficulties in reducing the size and the cost.

The magnetic detection apparatus having the magneto-resistance effect element uses the magneto-resistance effect of the magneto-resistance effect element to detect an external magnetic field. The magneto-resistance effect element is a magnetoelectrical conversion device using a magneto-resistance effect of a ferromagnetic thin film made of Ni alloy or the like, the magneto-resistance effect element having a characteristic with which the resistance value of which is changed in accordance with the intensity of the magnetic field applied thereto. Assuming, as shown in FIG. 3, that the angle made between the direction of the electric current I flowing in the magneto-resistance effect element 120 and the direction of magnetization M of the magneto-resistance effect element 120 realized attributable to the external magnetic field Hex is θ, the resistance value of the magneto-resistance effect element 120 obtainable when the direction of the electric current I and that of the magnetization M are the same is Ra and the resistance value of the magneto-resistance effect element 120 when the angle θ made between the direction of the electric current I and that of the magnetization M is 90° is Rb, the resistance value R of the magneto-resistance effect element 120 is expressed by Equation (1-2) below:

$$R = Rb + (Ra - Rb) \cdot \cos^2 \theta \qquad (1\text{-}2)$$

The above-mentioned Equation (1-2) is expressed by a graph shown in FIG. 4, wherein the axis of ordinate stands for the resistance value R of the magnet-resistance effect element 120 and the axis of abscissa stands for the angle θ made between the direction of the electric current I flowing in the magneto-resistance effect element 120 and that of the magnetization M of the magneto-resistance effect element 120 realized attributable to the external magnetic field Hex.

Since only a very small maximum value of the rate of the change in the resistance of about 2% to 3%, however, is obtained with the above-mentioned magnet-resistance effect element 120, a poor change in the resistance of about 0.05% can be obtained in a weak magnetic field generated by, for example, the geomagnetism even if a region exhibiting excellent sensitivity is employed by applying a bias magnetic field having an appropriate magnitude. Therefore, also the magnetic detection apparatus having the magneto-resistance effect element 120 has been unsatisfactory in terms of obtaining sensitivity required to detect a weak magnetic field generated by, for example, the geomagnetism. What is worse, the fact that the change rate of the resistance of the magneto-resistance effect element 120 has a large temperature coefficient of about 0.3%/°C. results in the magnetic detection apparatus having the magneto-resistance effect element 120 being allowed to encounter a problem of the temperature drift and the like.

As described above, the conventional magnetic detection apparatuses suffer from problems in that the sensitivity has been unsatisfactory and that the size and the cost cannot be reduced.

SUMMARY OF THE INVENTION

In view of the foregoing, an object of the present invention is to provide a magnetic detection apparatus, the size and cost of which can easily be reduced and with which excellent sensitivity can be obtained.

To achieve the foregoing object, according to one aspect of the present invention, there is provided a magnetic detection apparatus including: a magnetic sensor formed by winding a coil around a magnetic member, wherein change in a response waveform of an electric current allowed to flow in the coil of the magnetic sensor occurring when time-varying voltage is applied to the coil is detected, the response waveform corresponding to the intensity of an external magnetic field, and changes in the response wave form corresponding to changes in the external magnetic field. When the change of the response waveform corresponding to the intensity of the external magnetic field is detected, at least change in rise time of the response waveform or change in fall time of the same is detected.

The magnetic detection apparatus according to the present invention detects the change in the external magnetic field as the change in the inductance. That is, when the external magnetic field has been changed, the amount of magnetization of the magnetic member of the magnetic sensor is changed. As a result, the inductance of the magnetic sensor is changed. The change in the inductance appears in the form of change in the response waveform of the electric current allowed to flow in the coil. Therefore, by detecting the change in the response waveform, the external magnetic field can be detected.

The magnetic detection apparatus according to the present invention may include a resistor, in series, connected to the magnetic sensor. When the resistor is, in series, connected to the magnetic sensor, the inductance of the magnetic sensor and the time constant of the resistor, in series, connected to the magnetic sensor enable the degree of change in the response waveform corresponding to the intensity of the external magnetic field to be determined.

The structure in which the magnetic sensor and the resistor are connected in series may be arranged such that time-varying voltage generated in the resistor is applied to a Schmitt trigger circuit, and an output from the Schmitt trigger circuit and the time-varying voltage, which is applied to the coil of the magnetic sensor, are compared to each other so that the change in the response waveform is detected. When the Schmitt trigger circuit or the like is used to detect the change in the response waveform, the change in the response waveform is detected as change in the time required for the time-varying voltage generated in the resistor to be raised to a predetermined level or change in the time required for the time-varying voltage generated in the resistor to fall to a predetermined level.

It is preferable that the magnetic detection apparatus according to the present invention be structured such that the amplitude of the electric current which is allowed to flow in the coil of the magnetic sensor be set to include a range in which the inductance of the magnetic sensor is changed sharply. By setting the amplitude of the electric current as described above, the inductance of the magnetic sensor is considerably changed when the external magnetic field is changed. As a result, the sensitivity of the magnetic detection apparatus can be improved.

It is preferable that the magnetic detection apparatus according to the present invention be structured such that the electric current which is allowed to flow in the coil of the magnetic sensor contains a DC bias current component. By causing the electric current to contain the DC bias current component as described above, the value of the electric current can be set to a portion in which the inductance of the magnetic sensor is changed considerably. Therefore, the structure, in which the electric current contains the DC bias component, improves the sensitivity of the magnetic detection apparatus.

It is preferable that the magnetic detection apparatus according to the present invention further includes a bilateral switch for inverting the direction of the electric current allowed to flow in the coil of the magnetic sensor. When the bilateral switch is provided to invert the direction of the electric current allowed to flow in the coil of the magnetic sensor, the difference between the two directional currents is obtained so that an output substantially twice the output obtainable when the electric current is allowed to flow in one direction is obtained.

If the external magnetic field is zero when the direction of the electric current allowed to flow in the coil of the magnetic sensor is inverted, changes in the response waveform in the respective directions of the electric currents are canceled. Therefore, the magnetic detection apparatus having the bilateral switch enables the zero point, which is a state where no external magnetic field exists, to easily be recognized.

The structure in which the direction of the electric current allowed to flow in the coil is inverted in a short time is able to overcome temperature drift and time drift occurring in the inductance of the magnetic sensor because their influences can be canceled. Therefore, the magnetic detection apparatus having the bilateral switch is not affected by the temperature drift and the time drift of the inductance of the magnetic sensor so that an external magnetic field is accurately detected.

In the magnetic detection apparatus having the foregoing structure, one magnetic sensor is able to detect only a component of the external magnetic field in the lengthwise direction of the magnetic member of the magnetic sensor. Therefore, it is preferable that the magnetic detection apparatus be provided with a plurality of magnetic sensors. The magnetic detection apparatus having plural magnetic sensors is able to detect the direction of the external magnetic field in accordance with the magnitude of the magnetic field detected by each of the magnetic sensors.

Other objects, features and advantages of the invention will be evident from the following detailed description of the preferred embodiments described in conjunction with the attached drawings.

DETAILED DESCRIPTION OF THE PREFERRED EMBODIMENTS

Preferred embodiments of the present invention will now be described with reference to the drawings. Note that the present invention is not limited to the following embodiments and modifications and as a matter of course variations within the scope of the present invention are possible.

Initially, an example of a magnetic sensor for use in a magnetic detection apparatus according to the present invention will now be described.

Figure 1:
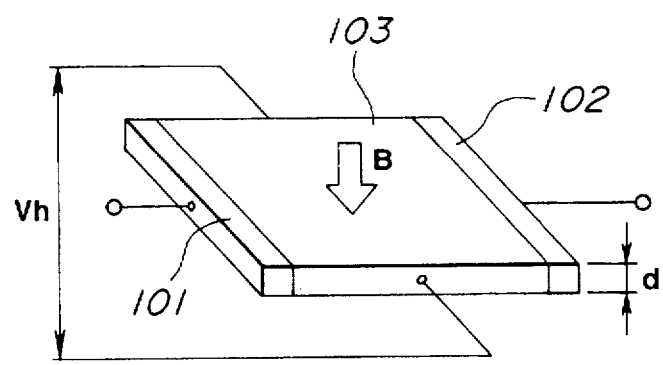
FIG. 1 is a schematic view showing an example of a magnetic detection apparatus having a Hall element.
Figure 2:
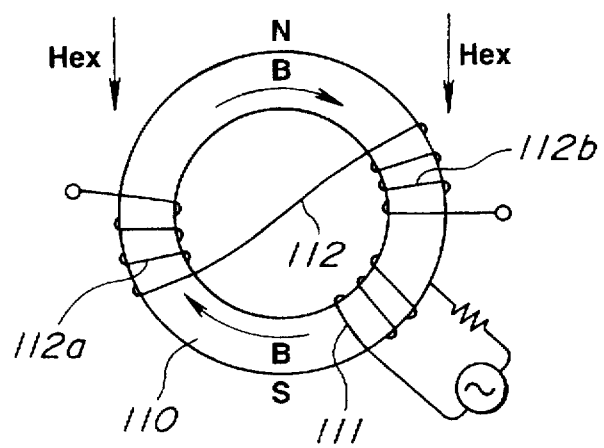
FIG. 2 is a schematic view showing an example of a magnetic detection apparatus having a flux gate sensor.
Figure 3:
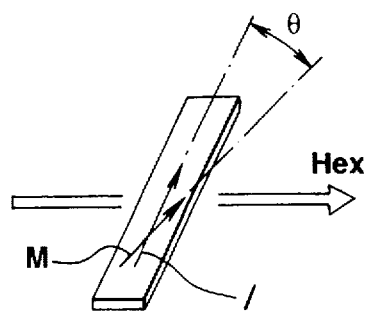
FIG. 3 is a schematic view showing an example of a magneto-resistance effect device.
Figure 4:
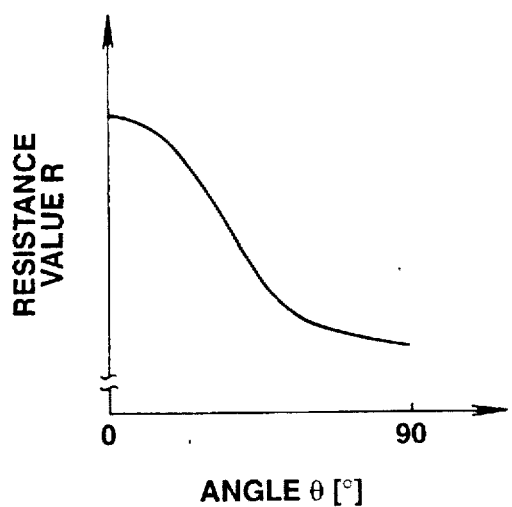
FIG. 4 is a graph showing the characteristic of the magneto-resistance effect of the magneto-resistance effect device.
Figure 5:
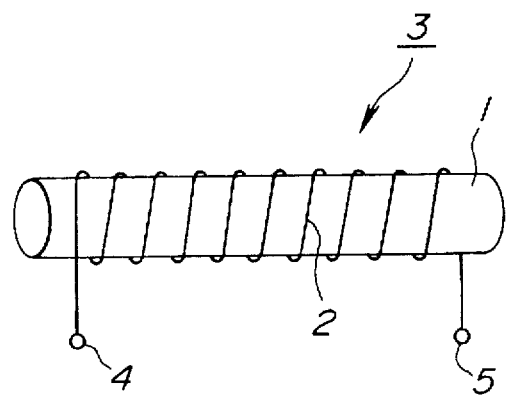
FIG. 5 is a schematic view showing an example of a magnetic sensor for use in a magnetic detection apparatus according to the present invention.

The magnetic sensor according to the present invention, as shown in FIG. 5, includes a magnetic member 1 made of, for example, an amorphous material formed into an elongated shape like a ribbon or a wire; and a coil 2 made of a copper wire or the like wound around the magnetic member 1 in the lengthwise direction of the same. The magnetic member 1 is made of a magnetic material having an excellent remanence characteristic with which the magnetic permeability is sharply changed even with a weak magnetic field of about several gauss. Two terminals 4 and 5 are extended from the coil 2 of the magnetic sensor 3.

Figure 6:
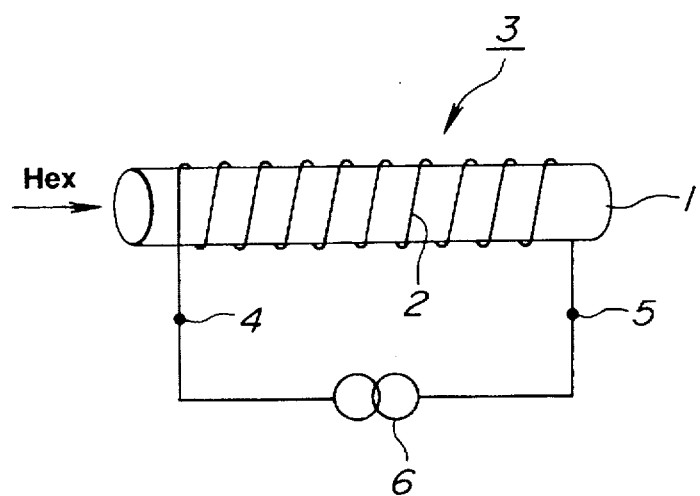
FIG. 6 is a schematic view showing a state where an exciting electric current is supplied to the magnetic sensor shown in FIG. 5.
Figure 7:
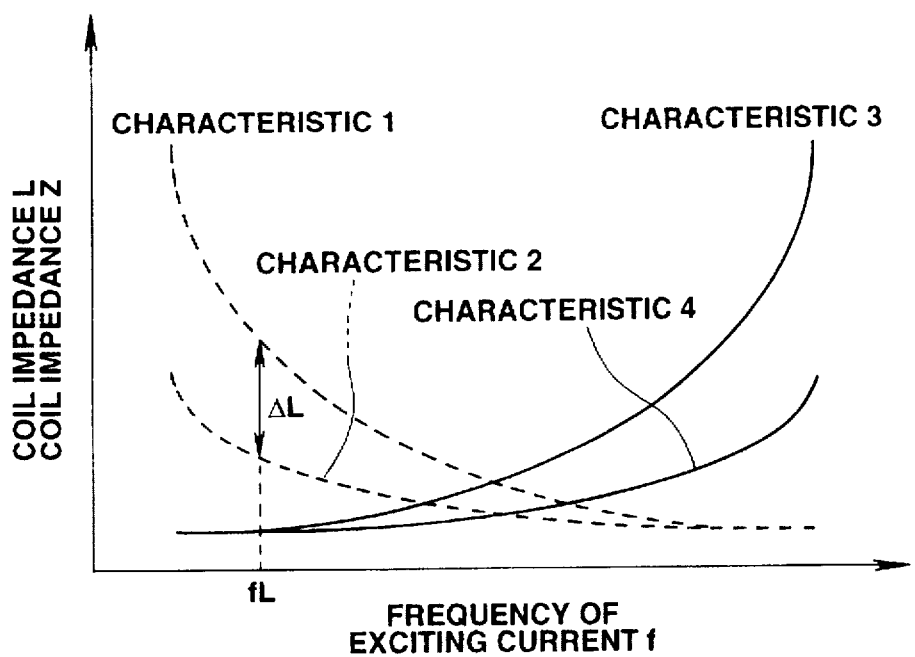
FIG. 7 is a graph showing the relationship among inductance L, impedance Z and frequency f of the exciting electric current in the magnetic sensor shown in FIG. 5.

When an AC source 6 is, as shown in FIG. 6, connected to the terminals 4 and 5 of the magnetic sensor 3 to supply an AC exciting electric current and external magnetic field Hex is applied to the magnetic sensor 3 in the lengthwise direction of the same, a characteristic shown in FIG. 7 is realized. FIG. 7 is a graph showing the relationship among inductance L of the magnetic sensor 3, impedance Z of the magnetic sensor 3 and frequency f of the exciting electric current supplied to the magnetic sensor 3.

Characteristic 1 shown in FIG. 7 shows change in the inductance L when the external magnetic field Hex is zero, characteristic 2 shown in FIG. 7 shows change in the inductance L when the external magnetic field Hex exists, characteristic 3 shown in FIG. 7 shows change in impedance Z when the external magnetic field Hex is zero and characteristic 4 shown in FIG. 7 shows change in the impedance Z when the external magnetic field Hex exists.

As can be understood from the characteristic 1 and 2 shown in FIG. 7, the inductance L of the magnetic sensor 3 is reduced when the frequency f of the exciting electric current is raised, while the same is reduced when the external magnetic field Hex is applied. As can be understood from the characteristics 3 and 4 shown in FIG. 7, the impedance Z of the magnetic sensor 3 is enlarged when the frequency f of the exciting electric current is raised, while the same is reduced when the external magnetic field Hex is applied.

Figure 8:
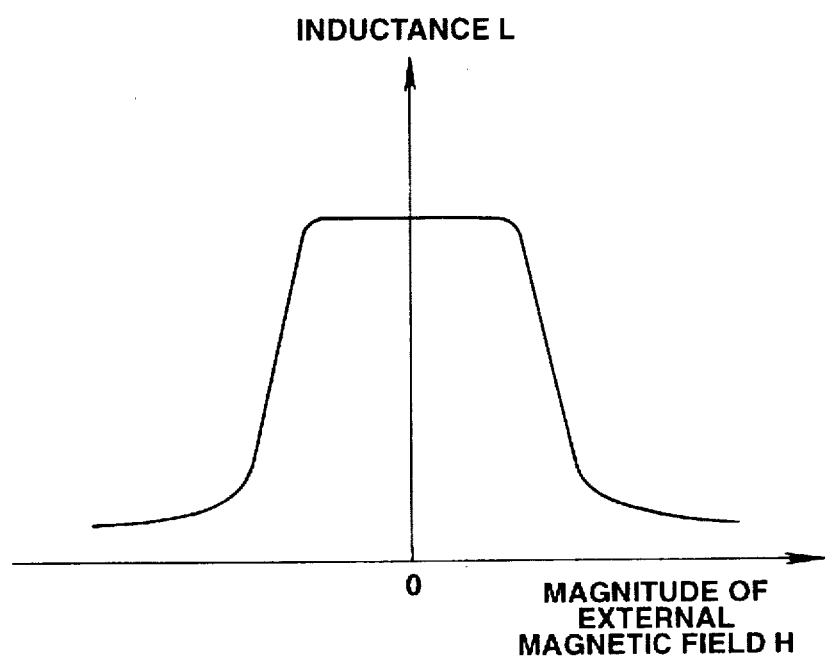
FIG. 8 is a graph showing the relationship between the inductance L of the magnetic sensor shown in FIG. 5 and the magnitude H of the external magnetic field.

Then, attention is paid to the change in the inductance L as indicated by the characteristics 1 and 2 shown in FIG. 7. The magnetic sensor 3 is operated with the frequency of the exciting electric current which considerably changes amount ΔL of change of the inductance L when the external magnetic field Hex is applied to the magnetic sensor 3 in the lengthwise direction of the same, that is, a frequency of the exciting electric current indicated by symbols fL shown in FIG. 7. At this time, dependency of the inductance L upon the external magnetic field is as shown in FIG. 8. Since the magnetic member 1 of the magnetic sensor 3 is made of the magnetic material having the excellent remanence characteristic which sharply changes the magnetic permeability even with a weak magnetic field of about several gauss, the inductance L of the magnetic sensor 3 is changed sharply, as shown in FIG. 8.

Figure 9:
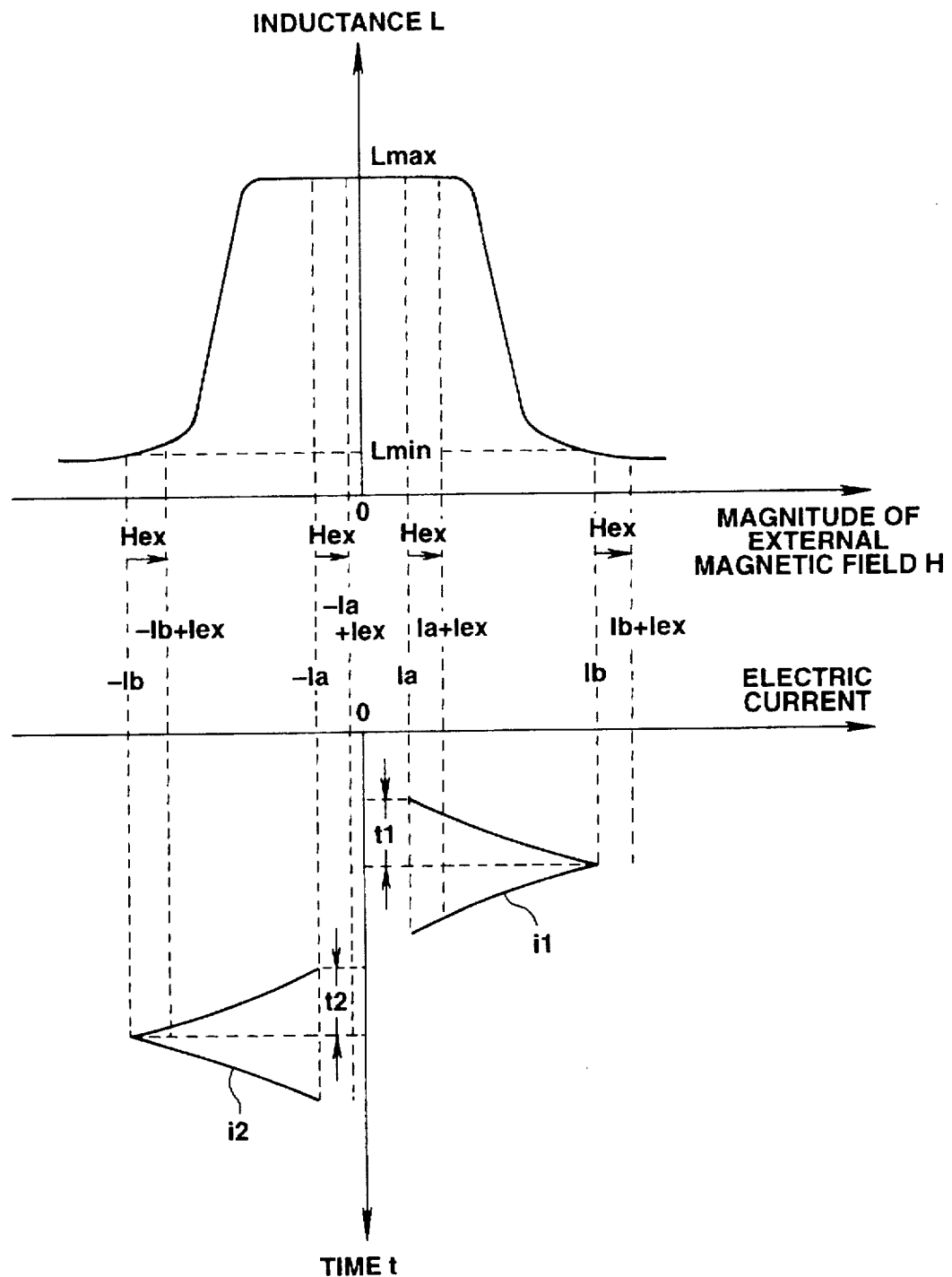
FIG. 9 is a graph for explaining the principle of detecting the external magnetic field by the magnetic sensor shown in FIG. 5.

The principle for detecting the external magnetic field Hex by using the magnetic sensor 3 structured as described above will now be described with reference to FIG. 9. FIG. 9 is a graph showing a state realized when AC bias current i1 or AC bias current i2 obtained by inverting the AC bias current i1 is supplied to the magnetic sensor 3, the state being made to correspond to change in the inductance L of the magnetic sensor 3.

When the external magnetic field Hex is detected by using the magnetic sensor 3, the AC bias current i1 containing a DC bias current component is supplied to the coil 2. Thus, the magnetic sensor 3 is magnetized in the lengthwise direction so that an AC bias magnetic field containing the DC bias magnetic field component is generated in the lengthwise direction of the magnetic sensor 3. The AC bias current i1, which is supplied to the coil 2, is determined in such a manner that the AC bias magnetic field is able to cover a range in which the inductance L of the magnetic sensor 3 is sharply changed even if the AC bias magnetic field is shifted because the external magnetic field Hex is applied.

When the AC bias current i1 is, as shown in FIG. 9, supplied in such a manner that the electric current, which flows in the coil 2 of the magnetic sensor 3, is changed from Ia to Ib when the external magnetic field Hex is zero, the inductance L of the magnetic sensor 3 is changed from Lmax to Lmin. If change in voltage V applied to the magnetic sensor 3 is constant, rise time t1 of the AC bias current i1 is expressed by Equation (2-1) below attributable to the Faraday's law:

$$t1 = \frac{1}{V} \int_{Ia}^{Ib} Ldi \, (V = Const) \quad (2\text{-}1)$$

When the external magnetic field Hex is applied in a state where the AC bias current i1 is being supplied, the electric current flowing in the magnetic sensor 3 is shifted by a degree corresponding to the external magnetic field Hex such that the electric current is changed from, for example, Ia+Iex to Ib+Iex. At this time, the AC bias current i1 is shifted by a degree corresponding to Iex, and the response waveform of the AC bias current i1 is changed. The response waveform of AC bias current i1 is changed such that, for example, the rise time t1 of the AC bias current i1 is changed by shift time $\Delta t1$ expressed by Equation (2-2) below:

$$\Delta t1 = \frac{1}{V} \left( \int_{Ia+Iex}^{Ib+Iex} Ldi - \int_{Ia}^{Ib} Ldi \right) \quad (2\text{-}2)$$

$$= \frac{1}{V} \left( \int_{Ib}^{Ib+Iex} Lmindi - \int_{Ia}^{Ia+Iex} Lmaxdi \right)$$

As described above, the rise time t1 of the AC bias current i1 is changed in accordance with change in the external magnetic field Hex. Therefore, the magnetic sensor 3 according to this embodiment is able to detect change in the external magnetic field Hex by detecting the amount of shift of the rise time t1 of the AC bias current i1.

Since the magnetic sensor 3 is structured such that the AC bias current i1 is determined in such a manner that the range, in which the inductance L is sharply changed, is covered even if the value of the AC bias current i1 is shifted by a degree corresponding to the external magnetic field Hex, shift time $\Delta t1$ is substantially linearly changed in accordance with the change in the external magnetic field Hex as can be understood from Equation (2-2). That is, the magnetic sensor 3 has excellent linearity in detecting the external magnetic field. As a result, the magnetic sensor 3 has an advantageous characteristic when used as a sensor for detecting a magnetic field. Moreover, the magnetic sensor 3, arranged to always use the sharp change in the inductance L, that is, great change from Lmax to Lmin, to detect the external magnetic field Hex, exhibits excellent sensitivity.

The operation, which is performed when the AC bias current i2, obtainable by inverting the AC bias current i1, is supplied to the magnetic sensor 3, will now be described.

In this case, the electric current, to be allowed to flow in the magnetic sensor 3, is inverted as shown in FIG. 9 so that the AC bias current i2 is supplied to the magnetic sensor 3 in such a manner that the electric current flowing in the magnetic sensor 3 is changed from −Ia to −Ib when the external magnetic field Hex is zero. Also in this case, the inductance L of the magnetic sensor 3 is changed from Lmax to Lmin. If the change in the voltage V to be applied to the magnetic sensor 3 is constant, rise time t2 of the AC bias current i2 is expressed by the following Equation (2-3) attributable to the Faraday's law, and, as can be understood from the same, t1 is made to be the same as t2:

$$t2 = \frac{1}{V} \int_{-Ia}^{-Ib} Ldi = t1 \quad (2\text{-}3)$$

If the external magnetic field Hex is applied in a state where the AC bias current i2 is being supplied, the electric current flowing in the magnetic sensor 3 is shifted by a degree corresponding to the external magnetic field Hex such that the same is, for example, changed from −Ia+Iex to −Ib+Iex. At this time, the AC bias current i2 is shifted by a degree corresponding to Iex and its response waveform is changed. The response waveform of AC bias current i2 is changed such that, for example, the rise time t2 of the AC bias current i2 is changed by shift time $\Delta t2$ expressed by Equation (2-4) below:

$$\Delta t2 = \frac{1}{V} \left( \int_{-Ia+Iex}^{-Ib+Iex} Ldi - \int_{-Ia}^{-Ib} Ldi \right) \quad (2\text{-}4)$$

$$= \frac{1}{V} \left( \int_{-Ia}^{-Ib+Iex} Lmaxdi - \int_{-Ia}^{-Ib+Iex} Lmindi \right)$$

$$= -\Delta t$$

As described above, when the AC bias current i2 obtained by inverting the AC bias current i1 is supplied, the rise time t2 of AC bias current i2 is changed in accordance with the change in the external magnetic field Hex. Shift time $\Delta t2$ has a sign opposite to that of the shift time $\Delta t1$ and the same direction as that of the shift time $\Delta t1$. That is, the shift time $\Delta t1$ and the shift time $\Delta t2$ have a differential relationship.

Therefore, rise time t1+$\Delta t1$ taken when the electric current is allowed to flow in a forward direction and rise time t2+$\Delta t2$ taken when the electric current is allowed to flow in the reverse direction are measured to obtain the difference between t1+$\Delta t1$ and t2+$\Delta t2$. As a result, a signal corresponding to the change in the external magnetic field Hex can be fetched as an output, the magnitude of which is about twice the output which can be fetched when the electric current is allowed to flow in one predetermined direction.

The foregoing operation of obtaining the difference between the rise time t1+$\Delta t1$ taken when the electric current is allowed to flow in a forward direction and rise time t2+$\Delta t2$ taken when the electric current is allowed to flow in the reverse direction causes the rise times of the respective AC bias currents to cancel each other out when the external magnetic field Hex is zero. As a result, a zero point, which is a state where the external magnetic field Hex does not exist, can easily be recognized.

Although the magnetic sensor 3 involves change in the magnitude of the inductance L attributable to temperature or the like and change in the rise time of the AC bias current, inversion of the direction of the AC bias current in a short time enables the influences of the temperature drift and the time drift to mutually be canceled. Therefore, the above-mentioned magnetic sensor is able to precisely detect the external magnetic field Hex without any influence of the temperature drift and the time drift.

An example of the structure of the magnetic detection apparatus using the above-mentioned magnetic sensor will now be described.

Figure 10:
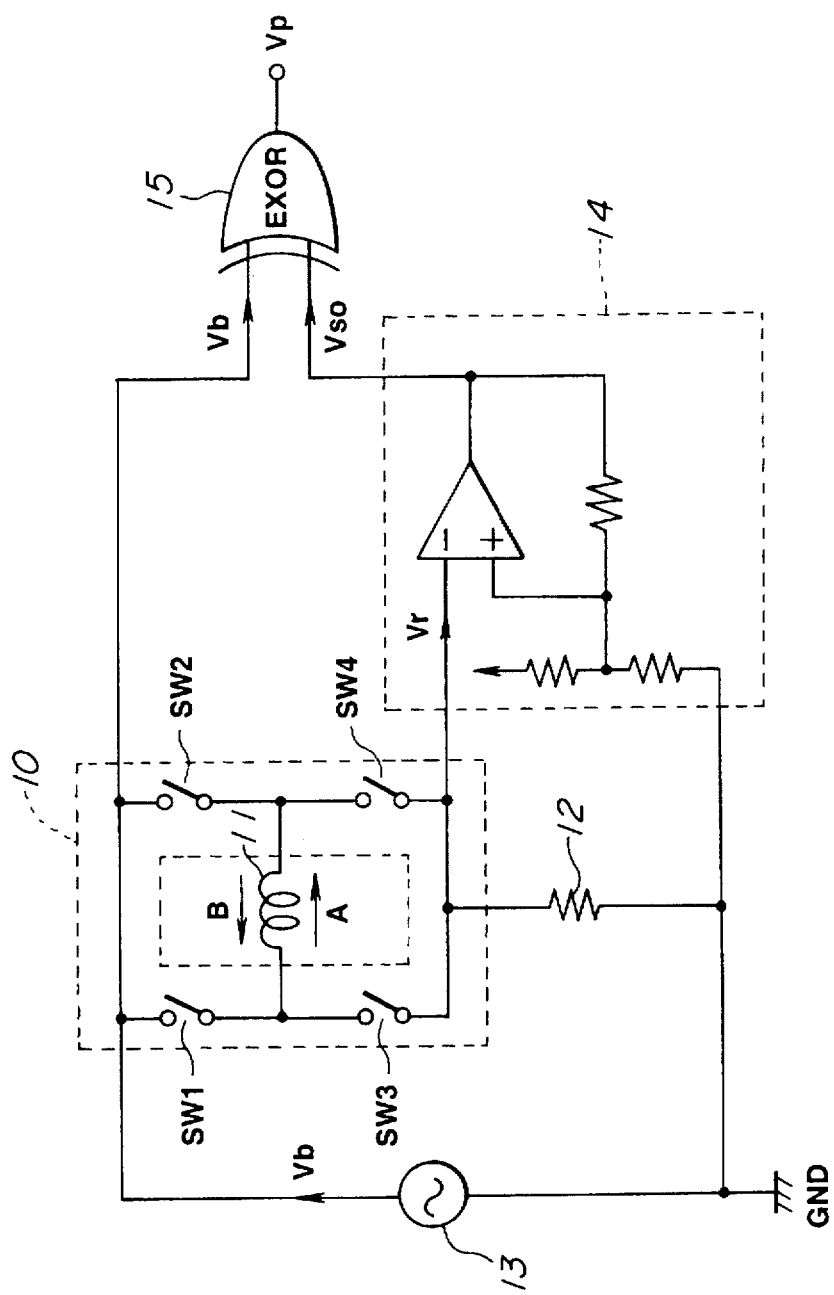
FIG. 10 is a circuit diagram showing the structure of an embodiment of the magnetic detection apparatus according to the present invention.

The magnetic detection apparatus, as shown in FIG. 10, includes a magnetic sensor 11 disposed in a bilateral switch 10; and a magnetoelectrical conversion circuit capable of converting the magnitude of the external magnetic field applied to the magnetic sensor 11 and outputting the electric signal. The magnetoelectrical conversion circuit has a resistor 12 connected to the bilateral switch 10; a time-varying-voltage supply source 13 for applying square wave-generating voltage Vb; a Schmitt trigger circuit 14 connected to lines extended from the two ends of the resistor 12; and a logic circuit 15 for subjecting, to a comparison, an output from the Schmitt trigger circuit 14 and the time-varying voltage applied from the time-varying-voltage supply source 13 with each other.

The magnetic sensor 11 is, as described above, composed of a magnetic member made of an elongated amorphous material formed into a ribbon-like shape or a wire-like shape; and a coil made of copper wire or the like wound around the magnetic member in the lengthwise direction of the magnetic member. The magnetic sensor 11 is disposed in the bilateral switch 10 having switches SW1, SW2, SW3 and SW4 to enable the direction of the electric current which flows in the magnetic sensor 11 to be inverted by the bilateral switch 10. The resistor 12 connected to the bilateral switch 10 is connected to be in series with respect to the magnetic sensor 11. The resistor 12 and the magnetic sensor 11 form an integrating circuit.

The two ends of the integrating circuit are connected to the time-varying-voltage supply source 13. The time-varying-voltage supply source 13 applies the square wave-generating voltage Vb to the integrating circuit so that an integration current is allowed to flow into the magnetic sensor 11 and the resistor 12. Note that the time-varying voltage to be applied from the time-varying-voltage supply source 13 is not limited to the rectangular shape. For example, the time-varying voltage may be in the form of a triangular wave or the like.

On the other hand, the Schmitt trigger circuit 14, connected to the wires extended from the two ends of the resistor 12, detects the time-varying voltage Vr generated in the resistor 12 when the above-mentioned integration current flows so as to output square wave-generating voltage Vso as a signal corresponding to the response waveform of the time-varying voltage Vr.

The square wave-generating voltage Vso, which is outputted from the Schmitt trigger circuit 14, is applied to the logic circuit 15. The logic circuit 15 is also applied with square wave-generating voltage Vb from the time-varying-voltage supply source 13. The logic circuit 15 subjects, to a comparison, the square wave-generating voltage Vso applied from the Schmitt trigger circuit 14 and square wave-generating voltage Vb applied from the time-varying-voltage supply source 13 to each other. As a result, the logic circuit 15, as described later, transmits pulse voltage signal Vp corresponding to the rise time or fall time of the time-varying voltage Vr generated in the resistor 12 when the integration current flows. The operation of the above-mentioned magnetic detection apparatus will now be described with reference to a time chart shown in FIG. 11, the time chart showing voltage waveforms of the respective sections when an electric current is allowed to flow in the magnetic sensor 11 in one direction by the bilateral switch 10.

Initially, square wave-generating voltage Vb is, as shown in FIG. 11A, applied from the time-varying-voltage supply source 13 to the magnetic sensor 11. As a result, the integration current flows in the integrating circuit composed of the magnetic sensor 11 and the resistor 12. As shown in FIG. 11B, the waveform of the time-varying voltage Vr generated in the resistor 12, that is, the waveform of the time-varying voltage Vr which is applied to the Schmitt trigger circuit 14, is made into a waveform in which a delay takes place at the rise time and the fall time with respect to the square wave-generating voltage Vb shown in FIG. 11A. The waveform of the time-varying voltage Vr corresponds to the response waveform of the electric current which flows in the magnetic sensor 11. Therefore, the delays respectively taken place at the rise time and the fall time of the time-varying voltage Vr are changed in accordance with the magnitude of the external magnetic field Hex applied to the magnetic sensor 11.

The Schmitt trigger circuit 14 compares the time-varying voltage Vr shown in FIG. 11B with Schmitt voltage VsH at the rise time and compares the same with Schmitt voltage VsL at the fall time so that square wave-generating voltage Vso, the waveform of which has been shaped as shown in FIG. 11C, is transmitted from the Schmitt trigger circuit 14. The Schmitt voltages VsL and VsH must be determined to include the change in the inductance of the magnetic sensor 11 from Lmax to Lmin occurring at the rise time and fall time of the electric current which flows in the magnetic sensor 11.

The logic circuit 15 subjects, to a comparison, the square wave-generating voltage Vb applied from the time-varying-voltage supply source 13 and shown in FIG. 11A, and the square wave-generating voltage Vso applied from the Schmitt trigger circuit 14 and shown in FIG. 11C with each other to obtain phase difference $\Delta$ts so as to transmit the pulse voltage signal Vp as shown in FIG. 11D. The pulse width of the pulse voltage signal Vp indicates the rise time or the fall time of the time-varying voltage Vr generated in the resistor 12 when the integration current flows in the integrating circuit composed of the magnetic sensor 11 and the resistor 12.

Since the waveform of the time-varying voltage Vr, as described above, corresponds to the response waveform of the electric current which flows in the magnetic sensor 11, the pulse width of the pulse voltage signal Vp transmitted from the logic circuit 15 indicates the rise time or the fall time of the electric current which flows in the magnetic sensor 11. Since the rise time or the fall time of the electric current, which flows in the magnetic sensor 11, depends upon the magnitude of the external magnetic field Hex as described above, the magnitude of the external magnetic field Hex, which is being applied to the magnetic sensor 11, can be detected in accordance with the pulse voltage signal Vp transmitted from the logic circuit 15.

In the above-mentioned magnetic detection apparatus, change in the external magnetic field Hex applied to the magnetic sensor 11, as described above, appears as change in the phase difference $\Delta$ts between the square wave-generating voltage Vb applied from the time-varying-voltage supply source 13 and the square wave-generating voltage Vso outputted from the Schmitt trigger circuit 14. The above-mentioned magnetic detection apparatus fetches the phase difference $\Delta$ts as the pulse voltage signal Vp so as to detect the external magnetic field Hex.

On the other hand, the magnetic detection apparatus according to this embodiment is able to cause the bilateral switch 10 to invert the direction of the electric current which flow in the magnetic sensor 11. Referring to FIG. 10, when the switches SW1 and SW4 are switched on and the switches SW2 and SW3 are switched off, the electric current flows in a direction indicated by an arrow A. When the switches SW1 and SW4 are switched off and the switches SW2 and SW3 are switched on, the electric current flows in a direction indicated by an arrow B. By detecting the external magnetic field Hex such that the direction of the electric current which flows in the magnetic sensor 11 is inverted by the bilateral switch 10, an output, the magnitude of which is twice an output obtainable when the electric current is allowed to flow in only one direction can be obtained. Moreover, the zero point, which is the state where the external magnetic field Hex does not exist, can easily be recognized. As a result, the influences of the temperature drift and the time drift can be eliminated.

The principle of appearance of the change in the external magnetic field Hex applied to the magnetic sensor 11 as the change in the phase difference Δts between the square wave-generating voltage Vb applied from the time-varying-voltage supply source 13 and the square wave-generating voltage Vso transmitted from the Schmitt trigger circuit 14 will be described further in detail.

Figure 12:
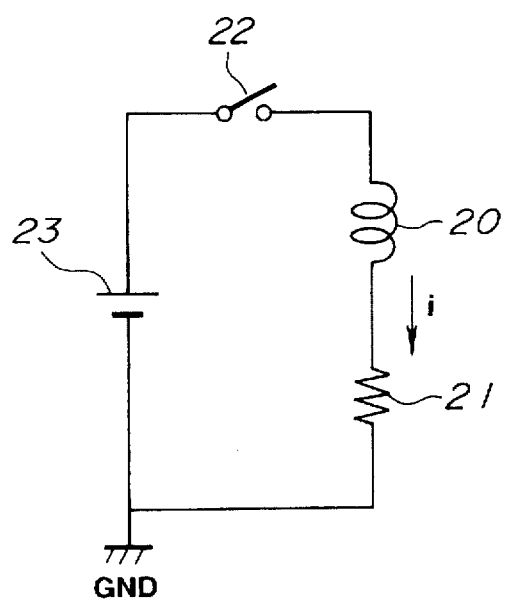
FIG. 12 is a circuit diagram showing a model of a state where an electric current rises in an integrating circuit consisting of a magnetic sensor and a resistor.

A circuit diagram is shown in FIG. 12 which shows a model of a state where an electric current rises in an integrating circuit in which the magnetic sensor and a resistor are connected in series. When a switch 22 in the above-mentioned circuit is switched on, a DC voltage is applied from a DC source 23 to an integrating circuit composed of a magnetic sensor 20 and a resistor 21 so that electric current i starts flowing into the magnetic sensor 20. Assuming that the level of the DC voltage to be applied to the integrating circuit is E, the inductance of the magnetic sensor 20 is L, the resistance value of the resistor 21 is R and the rise time of the electric current i is t, the electric current i which flows in the magnetic sensor 20 is expressed by Equation (2-5) below:

$$\left. \begin{array}{l} L\dfrac{di}{dt} + Ri = E \\ i = \dfrac{E}{R}(1 - e^{-\frac{R}{L}t}) \\ t = \dfrac{L}{R} \ln\dfrac{E}{E - Ri} \end{array} \right\} \quad (2\text{-}5)$$

As can be understood from Equation (2-5), the rise time t of the electric current i is in proportion to time constant L/R of the integrating circuit. Therefore, the integrating circuit of the foregoing is able to arbitrarily determine rise time t of the electric current i by changing the resistance value R of the resistor 21.

Note that the inductance L of the magnetic sensor 20 is, as described above, changed from Lmax to Lmin during the period in which the electric current i rises. The Schmitt voltages VsL and VsH are determined to include the change in the inductance L from Lmax to Lmin.

Figure 13:
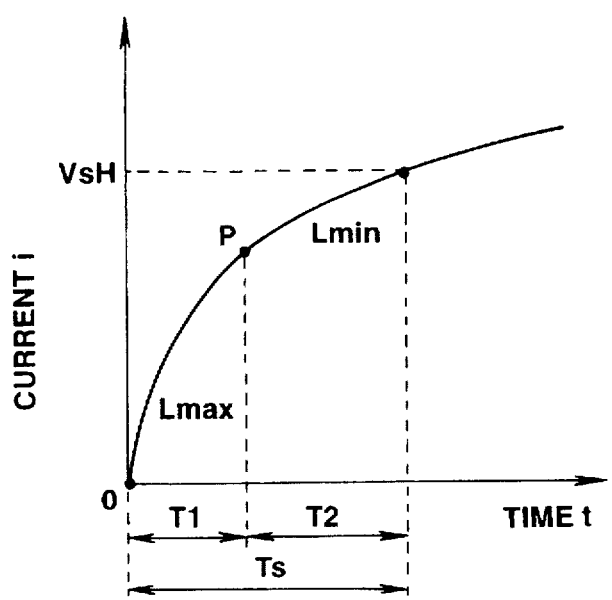
FIG. 13 is a graph showing a state where the electric current allowed to flow in the integrating circuit shown in FIG. 12 rises.

Since the inductance L of the magnetic sensor 20 is changed from Lmax to Lmin, the electric current i, which flow in the integrating circuit, initially rises in a state where the inductance L is Lmax, as shown in FIG. 13. Then, the electric current i rises in a state where the inductance L is Lmin. Therefore, time Ts required for the electric current i, which flows in the integrating circuit, to be enlarged to a level corresponding to the Schmitt voltage VsH is the total of rise time T1 required in a case where the inductance L is Lmax and rise time T2 required in a case where the inductance L is Lmin.

Figure 11:
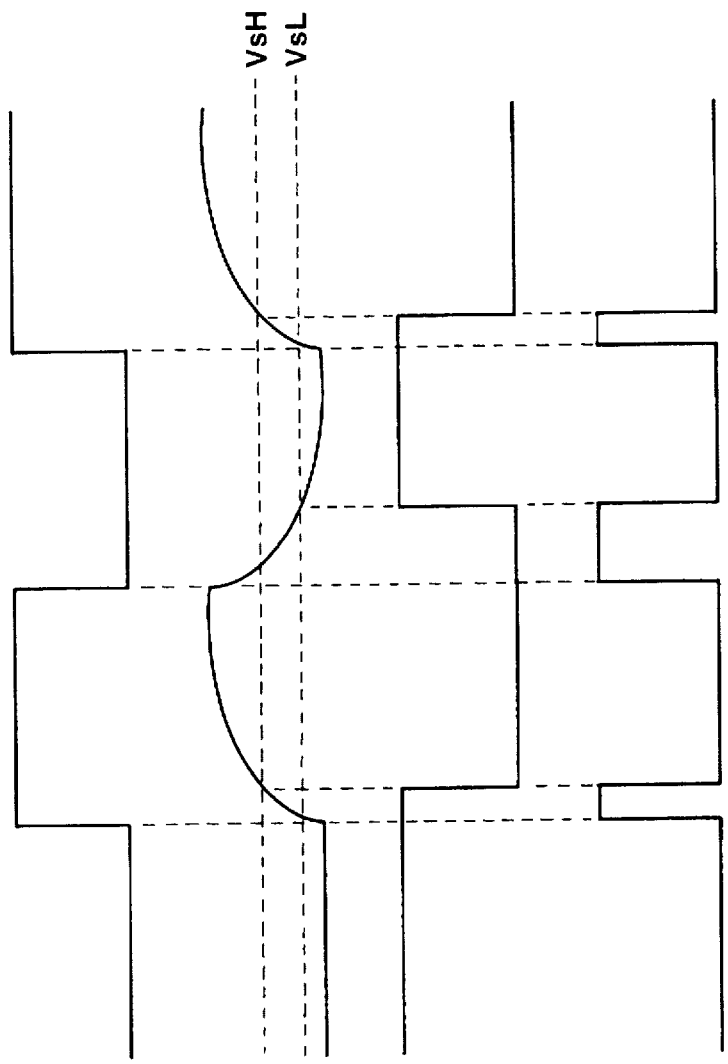
FIGS. 11A, 11B, 11C and 11D are time charts of voltage waveforms in the sections of the magnetic detection apparatus shown in FIG. 10.

When the external magnetic field Hex applied to the magnetic sensor 20 is changed, change point P, at which the inductance L is changed from Lmax to Lmin, is shifted by a degree corresponding to the degree of change in the external magnetic field Hex. Therefore, time Ts required for the integration current i to be increased to a value corresponding to the Schmitt voltage VsH is changed in accordance with the external magnetic field Hex. Therefore, as shown in FIGS. 10 and 11, change in the external magnetic field Hex applied to the magnetic sensor 11 appears as change in the phase difference Δts between the square wave-generating voltage Vb applied from the time-varying-voltage supply source 13 and the square wave-generating voltage Vso transmitted from the Schmitt trigger circuit 14.

Figure 14:
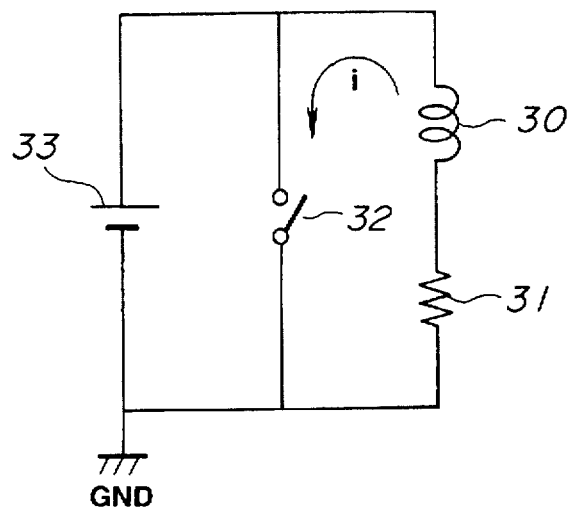
FIG. 14 is a circuit diagram showing a model of a state where the electric current allowed to flow in the integrating circuit consisting of the magnetic sensor and the resistor falls.

FIG. 14 is a circuit diagram showing a model of a state where the electric current i, which has been allowed to flow in an integrating circuit in which a magnetic sensor 30 and a resistance 31 are connected in series, arises. When a switch 32 in a circuit of the foregoing type is switched on, the DC voltage is not applied from the DC power source 33 to the integrating circuit so that the electric current, which has been allowed to flow in the magnetic sensor 30, falls. Assuming that the level of the DC voltage applied to the integrating circuit is E, the inductance L of the magnetic sensor 30 is L, the resistance value of the resistance 31 is R and fall time of the electric current is t, the electric current i allowed to flow in the magnetic sensor 30 is expressed by Equation (2-6) below:

$$\left. \begin{array}{l} i = \dfrac{E}{R} e^{-\frac{R}{L}t} \\ t = \dfrac{L}{R} \ln(E - Ri) \end{array} \right\} \quad (2\text{-}6)$$

Also in the foregoing case, when the external magnetic field Hex applied to the magnetic sensor 30 is changed, the point of change, at which the inductance L is changed from Lmax to Lmin, is shifted corresponding to the degree of the change in the external magnetic field Hex, similar to the case where the electric current rises. Therefore, the time required for the integration current i to be enlarged to a value corresponding to the Schmitt voltage VsL is changed. Therefore, as shown in FIGS. 10 and 11, and similarly to the case where the electric current falls, change in the external magnetic field Hex applied to the magnetic sensor 11 appears as change in the phase difference Δts between the square wave-generating voltage Vb applied from the time-varying-voltage supply source 13 and the square wave-generating voltage Vso transmitted from the Schmitt trigger circuit 14.

Figure 15:
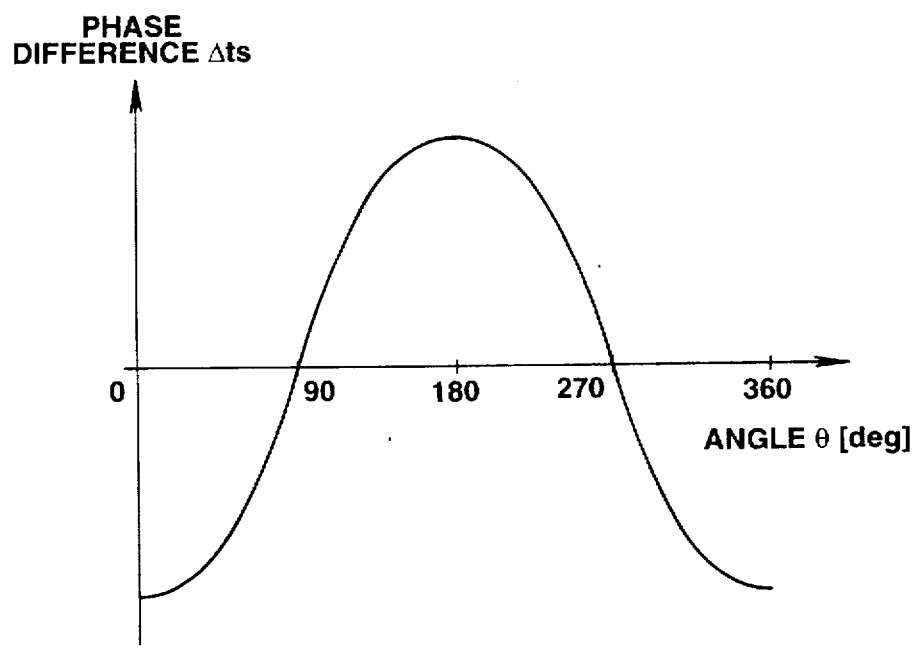
FIG. 15 is a graph showing the relationship among square wave-generating voltage Vb, square wave-generating voltage Vso and the direction of the external magnetic field Hex.

In the magnetic detection apparatus shown in FIG. 10, the phase difference Δts between the square wave-generating voltage Vb applied from the time-varying-voltage supply source 13 and the square wave-generating voltage Vso applied from the Schmitt trigger circuit 14 depends upon angle θ made between the external magnetic field Hex and a magnetic field generated in the lengthwise direction of the magnetic member of the magnetic sensor 11. That is, the phase difference Δts is, as shown in FIG. 15, changed depending upon the angle θ made between the external magnetic field Hex and the magnetic field generated in the lengthwise direction of the magnetic member of the magnetic sensor 11. Note that the azimuth is set to be zero in the graph shown in FIG. 15 when the direction of the external magnetic field Hex and that of the magnetic field generated in the lengthwise direction of the magnetic member of the magnetic sensor 11 are the same.

As can be understood from FIG. 15, the phase difference Δts includes information of the azimuth of the external magnetic field Hex. The reason for this is that the amount of magnetization of the magnetic member of the magnetic sensor 11 is the total of the amount of magnetization realized by the electric current i allowed to flow in the magnetic sensor 11 and the amount of magnetization realized by the external magnetic field Hex and that the amount of magnetization realized by the external magnetic field Hex is changed depending upon the angle θ made between the external magnetic field Hex and the magnetic field generated in the lengthwise direction of the magnetic member of the magnetic sensor 11.

Figure 16:
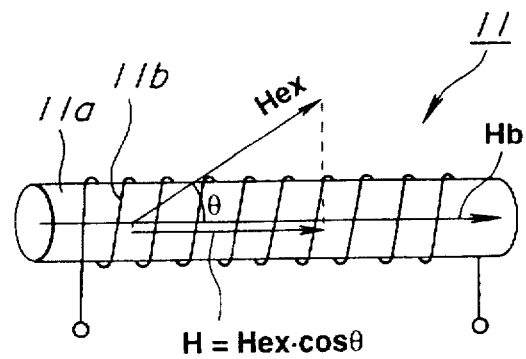
FIG. 16 is a schematic view showing a state where a magnetic member of the magnetic sensor is magnetized.

That is, as shown in FIG. 16, magnetic field Hb realized by the electric current i flowing in a coil 11b of the magnetic sensor 11 is constant, while the magnetic field, by the external magnetic field Hex, generated in a magnetic member of the magnetic sensor 11 depends upon the direction of the external magnetic field Hex. Therefore, magnetic field H which is detected by the magnetic sensor 11 has only a lengthwise-directional component of the magnetic member 11a of the external magnetic field Hex, as expressed by Equation (2-7) below:

$$H = Hex \cdot \cos \theta \tag{2-7}$$

Since the magnetic field H detected by the magnetic sensor 11, as expressed by Equation (2-7), includes information of the azimuth of the external magnetic field Hex, use of a plurality of geomagnetism sensors enables the direction of the external magnetic field Hex to be detected.

Figure 18:
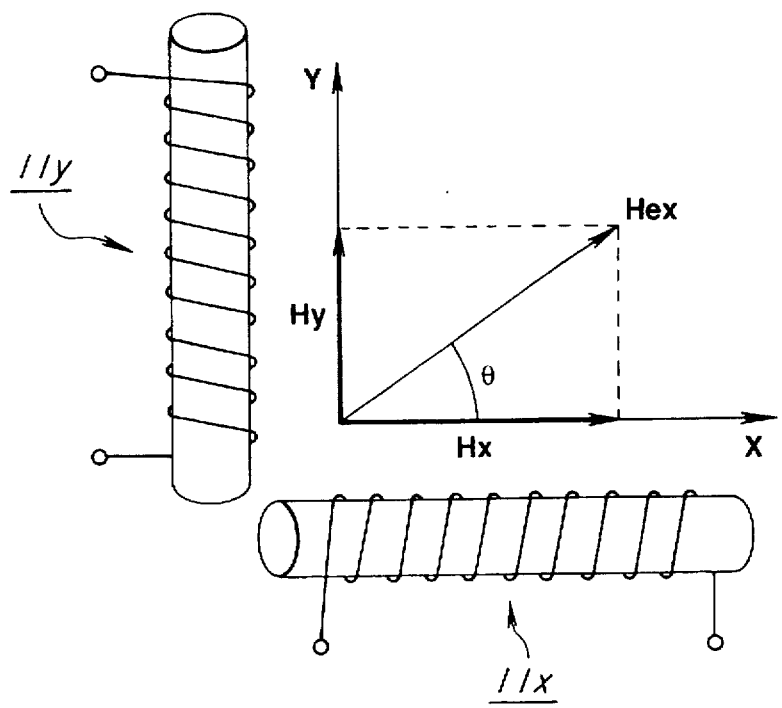
FIG. 18 is a schematic view showing the configuration of the magnetic sensors of the magnetic detection apparatus shown in FIG. 17.
Figure 17:
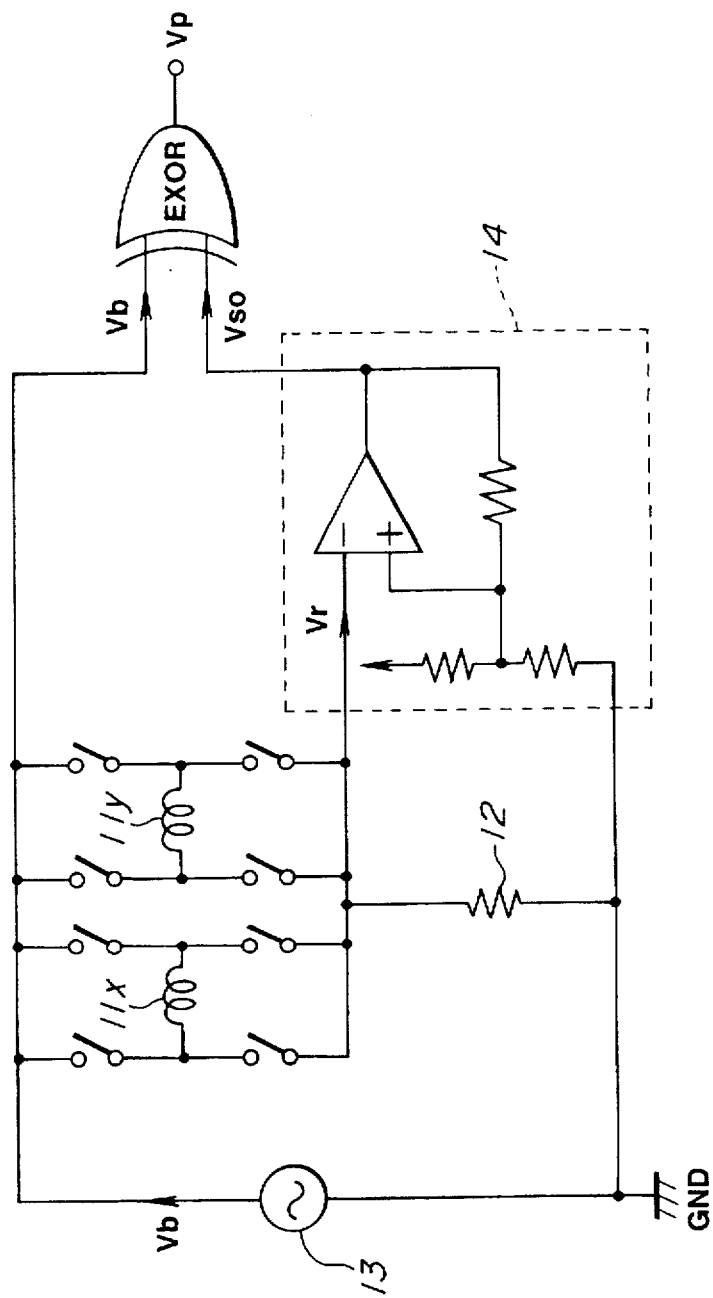
FIG. 17 is a circuit diagram showing the structure of another embodiment of the magnetic detection apparatus according to the present invention.

Specifically, two magnetic sensors 11x and 11y are built in the magnetic detection apparatus, as shown in FIG. 17. Note that the magnetic detection apparatus shown in FIG. 17 has a similar circuit structure as that of the magnetic detection apparatus shown in FIG. 10 except the two magnetic sensors are built in. As shown in FIG. 18, the magnetic sensor 11x is disposed in the direction of the X axis, while the magnetic sensor 11y is disposed in the direction of the Y axis which is perpendicular to the direction of the X axis. Assuming that the angle made between the direction of the external magnetic field Hex and the lengthwise direction of the magnetic member of the magnetic sensor 11x for detecting a magnetic field in the direction of the X axis is θ as shown in FIG. 18, magnetic field Hx, which is detected by the magnetic sensor 11x for detecting a magnetic field in the direction of the X axis, is expressed by Equation (2-8) below. Magnetic field Hy, which is detected by the magnetic sensor 11y for detecting a magnetic field in the direction of the Y axis, is expressed by Equation (2-9) below:

$$Hx = Hex \cdot \cos \theta \tag{2-8}$$

$$Hy = Hex \cdot \sin \theta \tag{2-9}$$

The ratio of the magnetic field Hx, which is detected by the magnetic sensor 11x for detecting a magnetic field in the direction of the X axis and the magnetic field Hy, which is detected by the magnetic sensor 11y for detecting a magnetic field in the direction of the Y axis, is expressed by Equation (2-10) below:

$$Hy/Hx = \sin \theta / \cos \theta = \tan \theta \tag{2-10}$$

Therefore, the angle θ made between the direction of the external magnetic field Hex and the lengthwise direction of the magnetic member of the magnetic sensor 11x for detecting a magnetic field in the direction of the X axis is expressed by Equation (2-11) below:

$$\theta = \tan^{-1}(Hy/Hx) \tag{2-11}$$

wherein when Hy≧0, 180°≧θ≧0°, and when 0>Hy, 360°>θ>180°.

The magnetic detection apparatus having two magnetic sensors is enabled to detect two-dimensional directions of the external magnetic field Hex.

When the three-dimensional direction and the magnitude of the external magnetic field are intended to be detected, that is, when the direction and the magnitude of the external magnetic field Hex in a stereo-space are intended to be detected, three magnetic sensors disposed perpendicularly to one another are required to be provided. Description will be performed about a magnetic detection apparatus having three magnetic sensors so as to be capable of detecting the direction and magnitude of an external magnetic field in a stereo-space.

Figure 19:
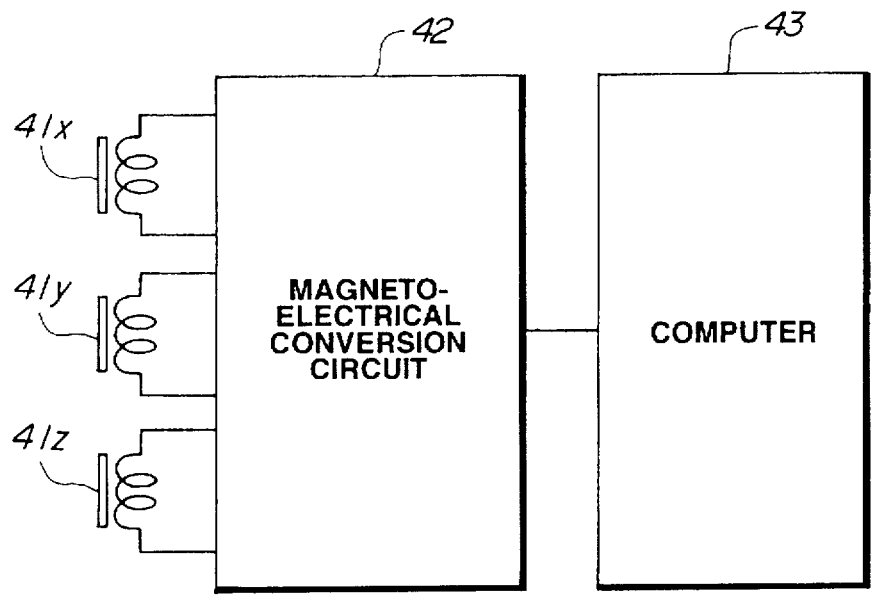
FIG. 19 is a block diagram showing an embodiment of a magnetic detection apparatus having three magnetic sensors.

The magnetic detection apparatus above, as shown in FIG. 19, has three magnetic sensors 41x, 41y and 41z. The magnetic sensors 41x, 41y and 41z are connected to the foregoing magnetoelectrical conversion circuit 42. An output terminal of the magnetoelectrical conversion circuit 42 is connected to an input terminal of a computer 43 so that the computer 43 performs a calculation operation in accordance with the output from the magnetoelectrical conversion circuit 42.

The magnetic sensors 41x, 41y and 41z are disposed in parallel to corresponding X, Y and Z axes which are perpendicular to one another. That is, the first magnetic sensor 41x is disposed in the direction of the X axis, the second magnetic sensor 41y is disposed in the direction of the Y axis and the third magnetic sensor 41z is disposed in the direction of the Z axis. The first magnetic sensor 41x detects the magnetic-field component in the direction of the X axis, the second magnetic sensor 41y detects the magnetic-field component in the direction of the Y axis and the third magnetic sensor 41z detects the magnetic-field component in the direction of the Z axis.

Each of the magnetic-field components detected by the corresponding magnetic sensors 41x, 41y and 41z is, as described above, converted into an electric signal by the magnetoelectrical conversion circuit 42, the electric signal being then supplied to the computer 43. The computer 43 performs the calculation operation in accordance with the magnetic-field components of the external magnetic field Hex in the directions of the X, Y and Z axes so as to calculate the direction and the magnitude of the external magnetic field Hex in the stereo-space.

A method of obtaining the direction and magnitude of the external magnetic field Hex in a stereo-space in accordance with the magnetic-field components of the external magnetic field Hex in the directions of the X, Y and Z axes will now be described.

Figure 20:
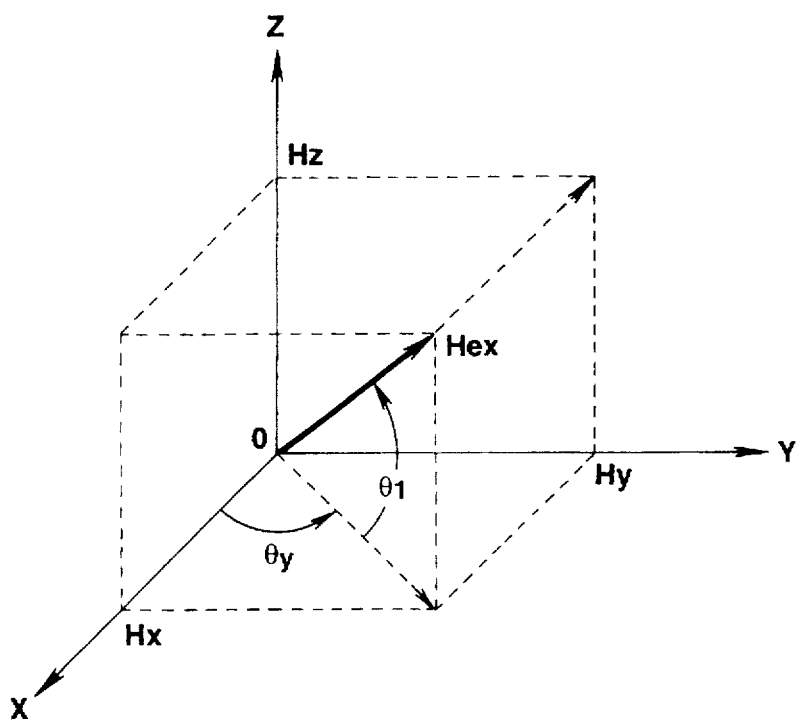
FIG. 20 is a diagram showing a magnetic field detected by three magnetic sensors.

The directions and magnitudes of the magnetic field detected by the magnetic detection apparatus having the three magnetic sensors 41x, 41y and 41z are expressed by vectors, as shown in FIG. 20. In FIG. 20, Hex is the external magnetic field, Hx is a magnetic-field component detected by the first magnetic sensor 41x, Hy is a magnetic-field component detected by the second magnetic sensor 41y and Hz is a magnetic-field component detected by the third magnetic sensor 41z.

The magnitude of the external magnetic field Hex in the stereo-space can be obtained by calculating the average root-mean-square of the magnetic-field component Hx detected by the first magnetic sensor 41x, the magnetic-field component Hy detected by the first magnetic sensor 41y and the magnetic-field component Hz detected by the first magnetic sensor 41z. That is, the magnitude of the external magnetic field Hex in a stereo-space can be expressed by Equation (3-1) below:

$$Hex=(Hx^2+Hy^2+Hz^2)^{1/2} \quad (3-1)$$

Referring to FIG. 20, angle θy is an angle made between the X axis and a vector obtained by, in parallel to the Z axis, projecting the external magnetic field Hex onto a plane formed by the X and Y axes, and angle θi is an angle made between the external magnetic field Hex and a vector obtained by, in parallel to the Z axis, projecting the external magnetic field Hex onto a plane formed by the X and Y axes.

The magnetic-field component Hx detected by the first magnetic sensor 41x is expressed by Equation (3-2) below, the magnetic-field component Hy detected by the second magnetic sensor 41y is expressed by Equation (3-3) and the magnetic-field component Hz detected by the third magnetic sensor 41z is expressed by Equation (3-4) below:

$$Hx = Hex \cdot \cos\theta i \cdot \cos\theta y \quad (3-2)$$

$$Hy = Hex \cdot \cos\theta i \cdot \sin\theta y \quad (3-3)$$

$$Hz = Hex \cdot \sin\theta i \quad (3-4)$$

The ratio of the magnetic-field component Hx detected by the first magnetic sensor 41x and the magnetic-field component Hy detected by the second magnetic sensor 41y is expressed by Equation (3-5) below:

$$Hy/Hx=\sin\theta y/\cos\theta y=\tan\theta y \quad (3-5)$$

Therefore, the angle θy is expressed by Equation (3-6) below:

$$\theta y=\tan^{-1}(Hy/Hx) \quad (3-6)$$

where when Hy≧0, 180°≧θy≧0°, and when 0>Hy, 360°>θy>180°.

Because of Equation (3-4) above, the angle θi is expressed by Equation (3-7) below:

$$\theta i=\sin^{-1}(Hz/Hex) \quad (3-7)$$

The computer performs the calculation expressed by Equation (3-1) above so that the magnitude of the external magnetic field Hex in a stereo-space is obtained. When the computer performs the calculations expressed by Equations (3-6) and (3-7) above, the direction of the external magnetic field Hex in a stereo-space can be obtained.

As described above, the magnetic sensors 41x, 41y and 41z perpendicular to one another are provided for the magnetic detection apparatus so that the direction and magnitude of the external magnetic field Hex in a stereo-space are detected.

Although the conventional magnetic detection apparatus is able to detect the direction and magnitude of an external magnetic field in a stereo-space if three magnetic sensors perpendicular to one another are provided, the conventional magnetic detection apparatus cannot easily be provided with the magnetic sensors in such a manner that the three magnetic sensors are perpendicular to one another to detect the direction and magnitude of an external magnetic field in a stereo-space.

For example, a magnetic detection apparatus including a flux gate sensor is enabled to detect the direction and magnitude of an external magnetic field in a stereo-space by disposing detection coils of the respective three flux gate sensors to be perpendicular to one another. However, it is very difficult to dispose three flux gate sensors, each having a relatively complicated structure, in such a manner that the detection coils are perpendicular to one another. Therefore, if the conventional magnetic detection apparatus is enabled to detect the direction and magnitude of an external magnetic field in a stereo-space, the manufacturing cost is raised excessively. As a result, the cost cannot be reduced.

On the other hand, since the magnetic sensor for use in the magnetic detection apparatus according to the present invention has a very simple structure, the magnetic sensors can easily be disposed to be perpendicular to one another. As a result, the present invention enables a magnetic detection apparatus capable of detecting the direction and magnitude of an external magnetic field in a stereo-space to be provided with a low cost.

When the magnetic detection apparatus having the three magnetic sensors 41x, 41y and 41z disposed perpendicular to one another is mounted on a mobile unit, such as a vehicle, to detect the geomagnetism, a state of the mobile unit with respect to the geomagnetism can be detected from a result of detection performed by the magnetic detection apparatus.

When the magnetic detection apparatus is mounted on a mobile unit, the sensors are, for example, disposed in such a manner that the first magnetic sensor 41x disposed in the direction of the X axis and the second magnetic sensor 41y disposed in the direction of the Y axis are disposed to be horizontal with respect to the mobile unit and the third magnetic sensor 41z disposed in the direction of the Z axis is disposed to be perpendicular to the mobile unit.

At this time, the angle θy indicates the azimuth in which the mobile unit faces. That is, calculation of the angle θy in accordance with the result of the detection operations performed by the three magnetic sensors 41x, 41y and 41z enables the azimuth in which the mobile unit faces to be detected.

The angle θi indicates the depression angle of the geomagnetism with respect to the mobile unit. The angle θi is always changed in accordance with the state of the mobile unit, and the degree of the change depends upon the state of the mobile unit. Therefore, the angle θi is calculated in accordance with results of detection performed by the magnetic sensors 41x, 41y and 41z and the degree of change in the angle θi is detected so that a state of the mobile unit is detected.

Specifically, when the magnetic detection apparatus is mounted on a vehicle, the angle θi is always changed in an angular range of about 5° attributable to jolting of the vehicle which is being driven. When the vehicle is stopped, the angle is changed in a small range of about 1°. Therefore, by detecting the degree of change in the angle θi, whether or not the vehicle is being driven can be detected.

As described above, the magnetic detection apparatus having the magnetic sensors 41x, 41y and 41z is mounted on a mobile unit, such as a vehicle, to cause the magnetic detection apparatus to detect the geomagnetism so that the azimuth and whether or not the vehicle is being driven are detected. The method of detecting a state of the mobile unit by using the magnetic detection apparatus may be employed in a so-called car navigation system or the like for informing information of a map and information of position to a person on the car.

The magnetic detection apparatus having the three magnetic sensors perpendicular to one another is as well as able to a rotational angle in a stereo-space. A magnetic detection apparatus having three magnetic sensors and capable of detecting a rotational angle in a stereo-space will now be described.

Figure 21:
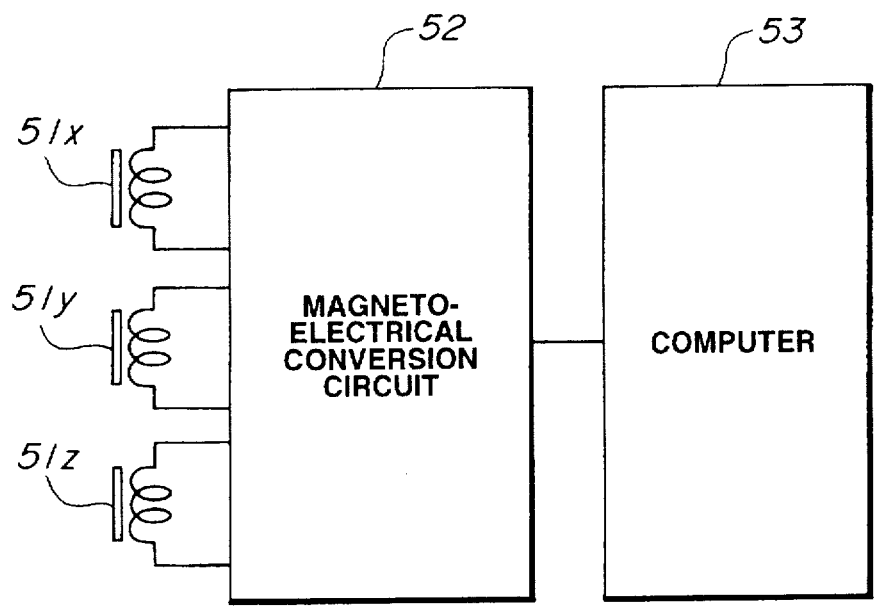
FIG. 21 is a block diagram showing the structure of another embodiment of the magnetic detection apparatus having three magnetic sensors.

As shown in FIG. 21, the magnetic detection apparatus has three magnetic sensors 51x, 51y and 51z perpendicular to one another. The magnetic sensors 51x, 51y and 51z are connected to the foregoing magnetoelectrical conversion circuit 52. An output terminal of the magnetoelectrical conversion circuit 52 is connected to an input terminal of the computer 53. As a result, a calculation process is performed by the computer 53 in accordance with the output from the magnetoelectrical conversion circuit 52.

The magnetic sensors 51x, 51y and 51z are disposed in parallel to the corresponding X, Y and Z axes perpendicular to one another. That is, the first magnetic sensor 51x is disposed in the direction of the X axis, the second magnetic sensor 51y is disposed in the direction of the Y axis and the third magnetic sensor 51z is disposed in the direction of the Z axis. The first magnetic sensor 51x detects the magnetic-field component in the direction of the X axis, the second magnetic sensor 51y detects the magnetic-field component in the direction of the Y axis and the third magnetic sensor 51z detects the magnetic-field component in the direction of the Z axis.

Each of the magnetic-field components detected by the corresponding magnetic sensors 51x, 51y and 51z is, as described above, converted into an electric signal by the magnetoelectrical conversion circuit 52, the electric signal being then supplied to the computer 53. The computer 53 performs the calculation operation in accordance with the magnetic-field components of the external magnetic field Hex in the directions of the X, Y and Z axes so as to calculate the rotational angle in the stereo-space.

A method of obtaining the rotational angle in a stereo-space in accordance with the magnetic-field component in the direction of the X axis, that in the direction of the Y axis and that in the direction of the Z axis will now be described.

Figure 22:
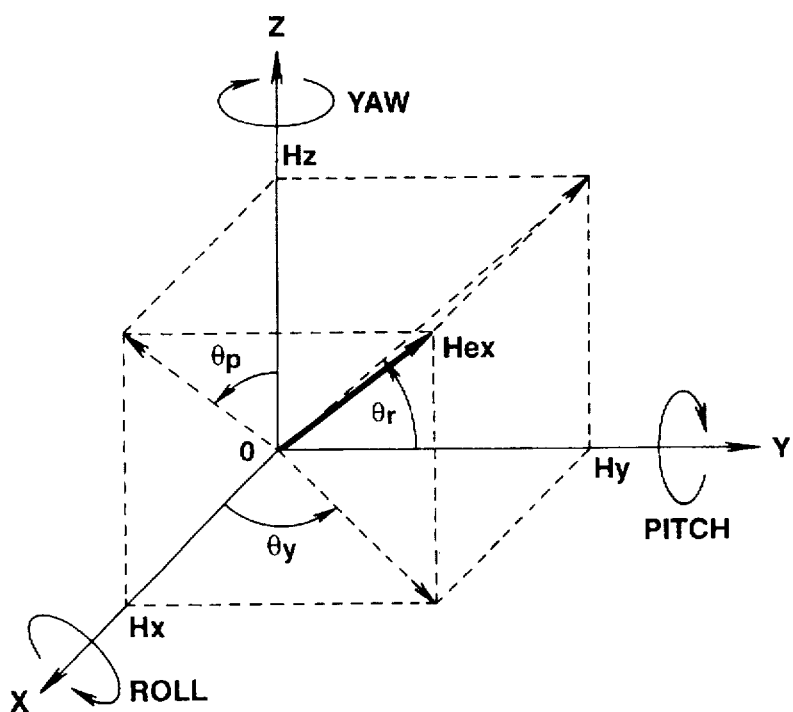
FIG. 22 is a diagram showing a magnetic field detected by three magnetic sensors.

The directions and magnitudes of the magnetic field detected by the magnetic detection apparatus having the three magnetic sensors 51x, 51y and 51z are expressed by vectors, as shown in FIG. 22. In FIG. 22, Hex is the magnitude of the external magnetic field, Hx is a magnetic-field component detected by the first magnetic sensor 51x, Hy is a magnetic-field component detected by the second magnetic sensor 51y and Hz is a magnetic-field component detected by the third magnetic sensor 51z.

Rotation relative to the X axis is defined to be rotation in the rolling direction and the rotational angle of the rotation in the rolling direction is represented by θr. Rotation relative to the Y axis is defined to be rotation in the pitching direction and the rotational angle in the pitching direction is represented by θp, while rotation relative to the Z axis is defined to be rotation in the yawing direction and the rotational angle in the yawing direction is represented by θy.

The rotational angle θr in the rolling direction is an angle made between the Y axis and a vector obtained when the external magnetic field Hex is, in parallel to the X axis, projected onto a plane formed by the Y axis and the Z axis. The rotational angle θp in the pitching direction is an angle made between the Z axis and a vector obtained when the external magnetic field Hex is, in parallel to the Y axis, projected onto a plane formed by the Z axis and the X axis. The rotational angle θy in the yawing direction is an angle made between the X axis and a vector obtained when the external magnetic field Hex is, in parallel to the Z axis, projected onto a plane formed by the X axis and the Y axis.

The rotational angle θr in the rolling direction is expressed by Equation (4-1) below:

$$\tan \theta r = Hz/Hy \tag{4-1}$$

Therefore, the rotational angle θr in the rolling direction is expressed by Equation (4-2) below:

$$\theta r = \tan^{-1}(Hz/Hy) \tag{4-2}$$

wherein when $Hz \geq 0$, $180° \geq \theta r \geq 0°$, and when $0 > Hz$, $360° > \theta r > 180°$.

The rotational angle θp in the pitching direction is expressed by Equation (4-3) below:

$$\tan \theta p = Hx/Hz \tag{4-3}$$

Therefore, the rotational angle θp in the pitching direction is expressed by Equation (4-4) below:

$$\theta p = \tan^{-1}(Hx/Hz) \tag{4-4}$$

wherein when $Hx \geq 0$, $180° \geq \theta p \geq 0°$, and when $0 > Hx$, $360° > \theta p > 180°$.

The rotational angle θy in the yawing direction is expressed by Equation (4-5) below:

$$\tan \theta y = Hy/Hx \tag{4-5}$$

Therefore, the rotational angle θy in the yawing direction is expressed by Equation (4-6) below:

$$\theta y = \tan^{-1}(Hy/Hx) \tag{4-6}$$

wherein when $Hy \geq 0$, $180° \geq \theta y \geq 0°$, and when $0 > Hy$, $360° > \theta y > 180°$.

Then, the computer 53 performs the calculation shown in Equation (4-2). As a result, the rotational angle θr in the rolling direction can be detected. Similarly, the computer 53 performs the calculation shown in Equation (4-4). As a result, the rotational angle θp in the pitching direction can be detected. Similarly, the computer 53 performs the calculation shown in Equation (4-6). As a result, the rotational angle θy in the yawing direction can be detected.

As described above, the magnetic sensors 51x, 51y and 51z perpendicular to one another are provided for the magnetic detection apparatus so that the rotational angles in the rolling direction, the pitching direction and the yawing direction are detected.

Although the conventional magnetic detection apparatus is able to detect the rotational angle in a stereo-space if three magnetic sensors perpendicular to one another are provided, the conventional magnetic detection apparatus cannot easily be provided with the magnetic sensors in such a manner that the three magnetic sensors are perpendicular to one another, as described above.

On the other hand, since the magnetic sensor for use in the magnetic detection apparatus according to the present invention has a very simple structure, the magnetic sensors can easily be disposed to be perpendicular to one another. As a result, the present invention enables a magnetic detection apparatus capable of detecting the rotational angle In a stereo-space to be provided with a low cost.

As described above, the magnetic detection apparatus according to the present invention uses change in the inductance, which is sharply changed when an external magnetic field is changed so as to detect the external magnetic field so that the external magnetic field is detected with excellent sensitivity. Moreover, since the magnetic detection apparatus according to the present invention has a very simple structure as described above, the size and cost of the apparatus can easily be reduced.

What is claimed is:

1. A magnetic field detection apparatus, comprising:

a time-varying voltage supply source;

a first magnetic sensor including an elongated magnetic member and a coil winding around the magnetic member;

a first bilateral electrical switch connected to both a first terminal of the time-varying voltage supply source and the first magnetic sensor wherein the first bilateral electrical switch may invert the direction of electrical current from the time-varying voltage supply source through the coil winding of the first magnetic sensor;

a resistor connected to the first bilateral electrical switch and a second terminal of the time-varying voltage supply source wherein the resistor is arranged in series with respect to the first magnetic sensor; and a detection circuit connected across the time-varying voltage supply source for detecting changes in rise time of a response waveform of the electrical current and changes in fall time of the response waveform of the electrical current corresponding to detected changes in an external magnetic field.

2. A magnetic field detection apparatus as claimed in claim 1, further comprising:

a Schmitt trigger circuit in the detection circuit, wherein the comparator circuit is connected to lines extending from two ends of the resistor for receiving a time-varying voltage generated in the resistor.

3. A magnetic field detection apparatus as claimed in claim 2, further comprising:

a comparator circuit in the detection circuit, wherein the comparator circuit is connected to both an output from the Schmitt trigger circuit and the first terminal of the time-varying voltage supply source wherein a comparison is made and the change in the response waveform is detected.

4. A magnetic field detection apparatus as claimed in claim 1, further comprising:

a DC bias current component in the electric current flowing into the coil of the first magnetic sensor from the time-varying voltage supply source.

5. A magnetic field detection apparatus as claimed in claim 1, wherein the time-varying voltage which is applied to the coil winding of the first magnetic sensor is a rectangular waveform.

6. A magnetic field detection apparatus as claimed in claim 1, further comprising:

a second magnetic sensor; and a second bilateral electrical switch connected in parallel to the first bilateral electrical switch and connected to the second magnetic sensor for inverting the direction of the electric current allowed to flow in the coil winding of the second magnetic sensor.

7. A magnetic field detection apparatus as claimed in claim 6, wherein the first and second magnetic sensors are positioned at 90° with respect to each other.

8. A magnetic field detection apparatus as claimed in claim 6, further comprising:

a third magnetic sensor; and a third bilateral electrical switch connected in parallel to both the first bilateral electrical switch and the second bilateral electrical switch and further connected to the third magnetic sensor for inverting the direction of the electric current allowed to flow in the coil winding of the third magnetic sensor.

9. A magnetic field detection apparatus as claimed in claim 8, wherein the third magnetic sensor is positioned at 90° with respect to both the first magnetic sensor and the second magnetic sensor.

10. A magnetic field detection apparatus as claimed in claim 8, further comprising:

a calculation unit for calculating the magnitude of the external magnetic field in a stereo-space in accordance with magnetic-field components detected by the first, second and third magnetic sensors.

11. A magnetic field detection apparatus as claimed in claim 8, further comprising:

a calculation unit for calculating a direction of the external magnetic field in a stereo-space in accordance with magnetic-field components detected by the first, second and third magnetic sensors.

12. A magnetic field detection apparatus as claimed in claim 8, further comprising:

a calculation unit for calculating a rotational angle in a stereo-space in accordance with magnetic-field components detected by the first, second and third magnetic sensors.

* * * * *